United States Patent
Kim et al.

(10) Patent No.: US 11,411,572 B2
(45) Date of Patent: Aug. 9, 2022

(54) ANALOG TO DIGITAL CONVERSION APPARATUS FOR PROVIDING DIGITAL VALUE TO DRIVER

(71) Applicant: SAMSUNG ELECTRO-MECHANICS CO., LTD., Gyeonggi-do (KR)

(72) Inventors: Gyu Won Kim, Suwon-si (KR); Yo Sub Moon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/183,619

(22) Filed: Feb. 24, 2021

(65) Prior Publication Data

US 2022/0166439 A1   May 26, 2022

(30) Foreign Application Priority Data

Nov. 24, 2020  (KR) .................... 10-2020-0158699

(51) Int. Cl.
| | |
|---|---|
| *H03M 1/06* | (2006.01) |
| *H03M 1/12* | (2006.01) |
| *H03K 17/693* | (2006.01) |
| *H03M 1/46* | (2006.01) |

(52) U.S. Cl.
CPC ........ *H03M 1/1215* (2013.01); *H03K 17/693* (2013.01); *H03M 1/46* (2013.01)

(58) Field of Classification Search
CPC ..... H03M 1/1215; H03M 1/46; H03K 17/693
USPC .......................................... 341/118, 120, 144
See application file for complete search history.

(56) References Cited

U.S. PATENT DOCUMENTS

| 5,663,729 A | 9/1997 | Wada et al. |
| 7,561,084 B1* | 7/2009 | Wong .................... H03M 1/127 341/123 |
| 2012/0194367 A1 | 8/2012 | Wang |
| 2012/0242314 A1* | 9/2012 | Namekawa ............. H03K 7/08 323/283 |
| 2013/0145066 A1* | 6/2013 | Kris ....................... H03M 1/06 710/262 |

(Continued)

FOREIGN PATENT DOCUMENTS

| JP | H8-95710 A | 4/1996 |
| JP | 2007-180732 A | 7/2007 |
| KR | 10-1999-0066052 A | 8/1999 |

(Continued)

OTHER PUBLICATIONS

Korean Office Action dated Nov. 22, 2021 in corresponding Korean Patent Application No. 10-2020-0158699 (9 pages in English and 6 pages in Korean).

(Continued)

*Primary Examiner* — Peguy Jean Pierre
(74) *Attorney, Agent, or Firm* — NSIP Law

(57) ABSTRACT

An analog-digital conversion apparatus includes: an analog-digital converter (ADC) included in an integrated circuit (IC) and configured to operate based on a sampling clock constituting a portion of a plurality of clocks; and a driver included in the IC and configured to operate based on another portion of the plurality of clocks, and produce a driving signal based on a digital value output from the ADC. The ADC and the driver are synchronized with each other based on an interrupt request (Irq) of the IC.

20 Claims, 12 Drawing Sheets

(56) References Cited

U.S. PATENT DOCUMENTS

2019/0086633 A1* 3/2019 Kim .................. G02B 7/09

FOREIGN PATENT DOCUMENTS

| KR | 10-2001-0098063 A | 11/2001 |
| KR | 10-2012-0088603 A | 8/2012 |
| KR | 10-1234944 B1 | 2/2013 |
| KR | 10-2015-0137788 A | 12/2015 |
| KR | 10-2019-0033132 A | 3/2019 |

OTHER PUBLICATIONS

Korean Office Action dated May 30, 2022 in corresponding Korean Patent Application No. 10-2020-0158699. (5 pages in English and 4 pages in Korean).

* cited by examiner

ANALOG TO DIGITAL CONVERSION APPARATUS FOR PROVIDING DIGITAL VALUE TO DRIVER

CROSS-REFERENCE TO RELATED APPLICATIONS

This application claims the benefit under 35 U.S.C. § 119(a) of Korean Patent Application No. 10-2020-0158699 filed on Nov. 24, 2020, in the Korean Intellectual Property Office, the entire disclosure of which is incorporated herein by reference for all purposes.

BACKGROUND

1. Field

The following description relates to an analog to digital conversion apparatus for providing a digital value to a driver.

2. Description of Related Art

In general, electronic devices may include a component such as a camera module, a position of which should be controlled, and a driver may control the position of the component by driving the component. The driver may receive position and/or acceleration information of the component and calculate a value for accurately driving the component according to control logic (e.g., optical image stabilization and/or auto focus control) based on said information as well as driving the component based on the value. Since the position and/or acceleration information of the component is collected as an analog value, an analog-to-digital converter may convert the analog value into a digital value and provide the digital value to the driver.

As optical magnification of the lens in the camera module increases and a lens barrel of a lens module becomes longer, a detection range of the position and/or acceleration of the lens module may increase, and a number of sensors for detecting the position and/or acceleration may also increase. Accordingly, timing control of the analog-to-digital conversion apparatus may become complicated, and a number of clocks used in the analog-to-digital conversion apparatus may increase.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, analog-digital conversion apparatus includes: an analog-digital converter (ADC) included in an integrated circuit (IC) and configured to operate based on a sampling clock constituting a portion of a plurality of clocks; and a driver included in the IC and configured to operate based on another portion of the plurality of clocks, and produce a driving signal based on a digital value output from the ADC. The ADC and the driver are synchronized with each other based on an interrupt request (Irq) of the IC.

The Irq may be a timer Irq of the IC.

The ADC may include: an ADC modulator configured to convert an analog value into the digital value, based on the sampling clock; and an ADC controller configured to determine whether the ADC is in an enable state based on the Irq, and control the ADC modulator based on a point in time at which the enable state changes.

The ADC controller may be further configured to control a conversion timing of the ADC modulator, based on a start-of-conversion time signal having a unit analog-digital conversion period. A start-of-conversion time of the start-of-conversion time signal may be synchronized at the point in time at which the enable state changes.

The ADC may include: an ADC modulator configured to convert an analog value into the digital value, based on the sampling clock; and an ADC controller configured to control a conversion timing of the ADC modulator, based on a start-of-conversion time signal having a unit analog-digital conversion period. A reference point in time of the start-of-conversion time signal may be determined depending on a point in time at which the ADC controller receives the Irq.

The ADC may include: an ADC modulator configured to sequentially convert at least one analog value input from at least one channel into the digital value; and an ADC controller configured to generate a reset signal corresponding to a conversion timing of the at least one analog value of the ADC modulator, based on a start-of-conversion time signal having a period in which the at least one analog value is converted into the digital value, and provide the reset signal to the ADC modulator.

The at least one channel may correspond to at least one hall sensor.

The driver may be further configured to perform a PID control action based on the digital value, and generate the driving signal based on the PID control action. A period of the PID control action may be determined based on the other portion of the plurality of clocks, and the other portion of the clocks may be linked to the Irq.

The driver may be further configured to generate a driving current corresponding to the driving signal, based on the PID control action, and output the driving current to a voice coil motor.

The ADC may include: a first ADC configured to convert a first analog value into a first digital value, based on a first sampling clock of the sampling clock; and a second ADC configured to convert a second analog value into a second digital value, based on a second sampling clock of the sampling of clock. The first and second ADCs may be synchronized with each other based on the Irq.

In another general aspect, an analog-digital conversion apparatus includes: a first analog-digital converter (ADC) included in an integrated circuit (IC), and configured to convert a first analog value into a first digital value, based on a first sampling clock constituting a portion of a plurality of clocks; and a second ADC included in an integrated circuit (IC) and configured to convert a second analog value into a second digital value, based on a second sampling clock constituting another portion of the plurality of clocks. The first and second ADCs are configured to be synchronized with each other based on an interrupt request (Irq) of the IC.

The Irq may be a timer Irq of the IC.

The first ADC may include: a first ADC modulator configured to convert the first analog value into the first digital value, based on the first sampling clock; and a first ADC controller configured to determine whether the first ADC controller is in a first enable state, based on the Irq, and configured to control the first ADC modulator, based on a point in time at which the first enable state changes. The second ADC may include: a second ADC modulator configured to convert the second analog value into the second digital value, based on the second sampling clock; and a second ADC controller determining whether the second ADC controller is in a second enable state, based on the Irq, and configured to control the second ADC modulator, based on a point in time at which the second enable state changes.

The first ADC controller may be further configured to control a conversion timing of the first ADC modulator, based on a first start-of-conversion time signal having a first unit analog-digital conversion period. A start-of-conversion time of the first start-of-conversion time signal may be synchronized at the point in time at which the first enable state changes. The second ADC controller may be further configured to control a conversion timing of the second ADC modulator, based on a second start-of-conversion time signal having a second unit analog-digital conversion period. A start-of-conversion time of the second start-of-conversion time signal may be synchronized at the point in time at which the second enable state changes.

The first ADC may include: a first ADC modulator configured to convert the first analog value into the first digital value, based on the first sampling clock; and a first ADC controller configured to control a conversion timing of the first ADC modulator, based on a first start-of-conversion time signal having a first unit analog-digital conversion period. The second ADC may include: a second ADC modulator configured to convert the second analog value into the second digital value, based on the second sampling clock; and a second ADC controller configured to control a conversion timing of the second ADC modulator, based on a second start-of-conversion time signal having a second unit analog-digital conversion period. A reference point in time of the first start-of-conversion time signal may be determined depending on a point in time at which the first ADC controller receives the Irq. A reference point in time of the second start-of-conversion time signal may be determined depending on a point in time at which the second ADC controller receives the Irq.

The first ADC may include: a first ADC modulator configured to sequentially convert at least one first analog value input from at least one first channel into the first digital value; and a first ADC controller configured to generate a first reset signal corresponding to a conversion timing of the at least one first analog value of the first ADC modulator, based on a first start-of-conversion time signal having a period in which the at least one first analog value is converted into the first digital value, and provide the first reset signal to the first ADC modulator. The second ADC may include: a second ADC modulator configured to sequentially convert at least one second analog value input from at least one second channel into the second digital value; and a second ADC controller configured to generate a second reset signal corresponding to a conversion timing of the at least one second analog value of the second ADC modulator, based on a second start-of-conversion time signal having a period in which the at least one second analog value is converted into the second digital value, and provide the second reset signal to the second ADC modulator.

In another general aspect, a camera module includes: a lens module; a sensor configured to detect a position of the lens module, and generate an analog value based on the detected position of the lens module; and an integrated circuit (IC). The IC includes: an analog-digital converter (ADC) configured to convert the analog value into a digital value based on a sampling clock constituting a portion of a plurality of clocks; and a driver configured to operate based on another portion of the plurality of clocks, and produce a driving signal, based on a digital value output from the ADC, to move the lens module. The ADC and the driver are synchronized with each other based on an interrupt request (Irq) of the IC.

The Irq may be a timer Irq of the IC.

The ADC may be further configured to determine whether the ADC is in an enable state based on the Irq. The ADC may be configured to control the converting of the analog value into the digital value based on a point in time at which the enable state changes.

The driver may be further configured to perform a PID control action based on the digital value, and generate the driving signal based on the PID control action. A period of the PID control action may be determined based on the other portion of the plurality of clocks, and the other portion of the clocks may be linked to the Irq.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1A:
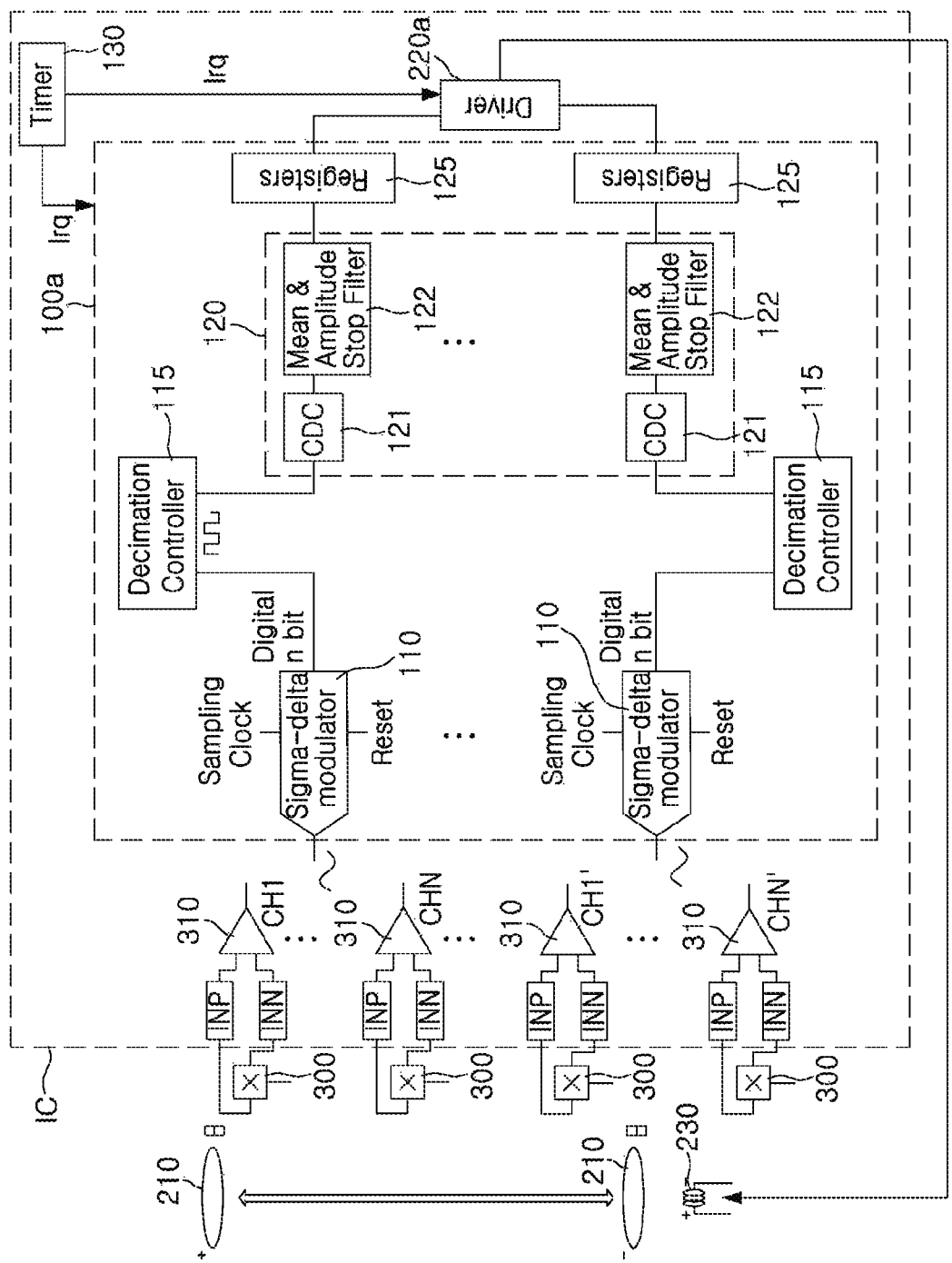
FIGS. 1A to 1C are diagrams illustrating various methods of synchronization based on an interrupt request (Irq) of an analog-to-digital conversion apparatus, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

Figure 1B:
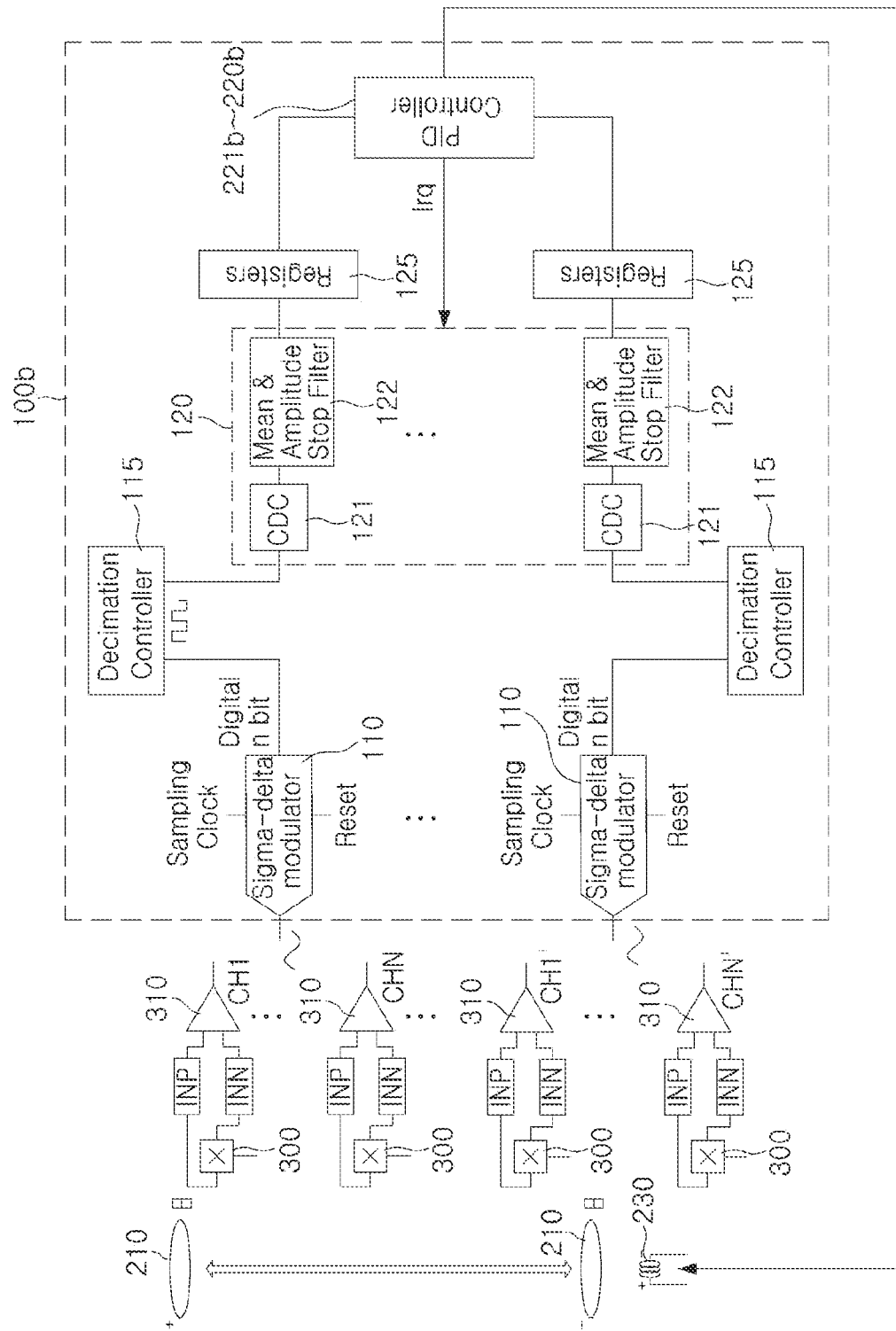
Figure 1C:
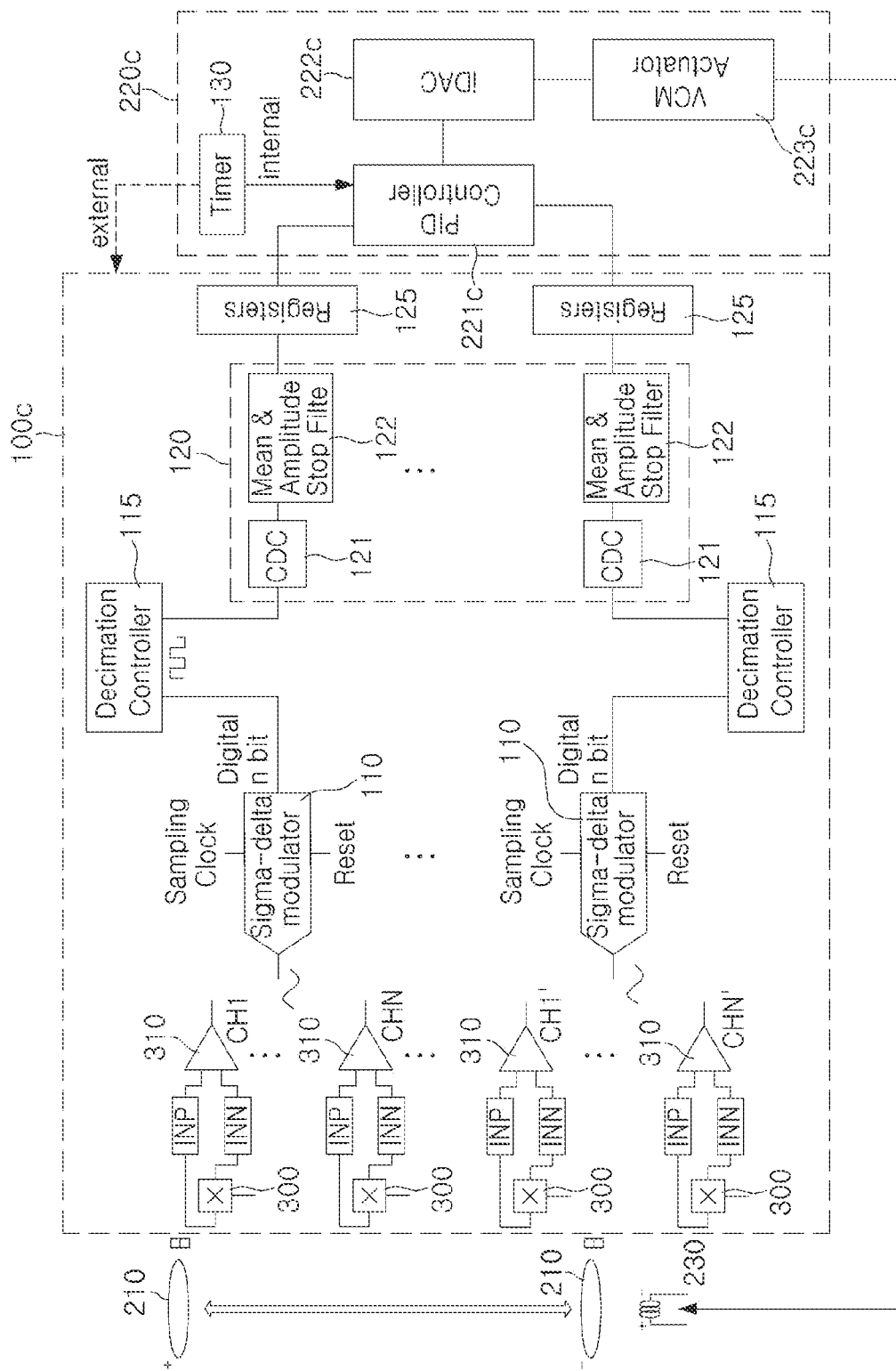

FIGS. 1A to 1C are diagrams illustrating various methods of synchronization based on an interrupt request (Irq) of an analog-to-digital conversion apparatus, according to an embodiment.

Referring to FIG. 1A, an analog-digital conversion apparatus may include an analog-digital converter (ADC) 100*a* and may further include a driver 220*a*.

The ADC 100*a* is included in an integrated circuit (IC) and may operate based on a sampling clock that constitutes a portion of a plurality of clocks.

The driver 220*a* is included in the IC, and may operate based on another portion of the plurality of clocks and produce a driving signal based on a digital value output from the ADC 100*a*.

As different groups of clocks are provided to the ADC 100*a* and the driver 220*a*, effects of the sampling clock of the ADC 100*a* and the clocks of the driver 220*a* on each other may be reduced. Accordingly, the driver 220*a* and the ADC 100*a* may have reduced noise, while the ADC 100*a* may have a high resolution in accordance with the reduced noise. Further, a timing configuration of the ADC 100*a* may be independent of that of the driver 220*a*, and ADC 100*a* may be more sophisticated or accurate.

The ADC 100*a* and the driver 220*a* may be synchronized with each other based on an interrupt request (Irq) of the IC. In this regard, timing controls for the ADC 100*a* and the driver 220*a* may be more sophisticated or accurate even when the ADC 100*a* and the driver 220*a* operate based on the different groups of clocks. Accordingly, performance (e.g., a signal-to-noise ratio, a conversion speed, resolution, power consumption, reliability, etc.) of the ADC 100*a* may be further improved.

The ADC 100*a* may include a first ADC (an upper half of 100*a*) and a second ADC (a lower half of 100*a*).

The first ADC (the upper half of 100*a*) is included in the IC and may convert a first analog value into a first digital value (upper digital-n-bit) provided to the driver 220 based on a first sampling clock (an upper sampling clock), which is a portion of the plurality of clocks, while the second ADC (the lower half of 100*a*) is included in the IC and may convert a second analog value into a second digital value (lower digital-n-bit) provided to the driver 220 based on a second sampling clock (a lower sampling clock), which is a portion of the plurality of clocks.

That is, the first and second ADCs (upper/lower halves of 100*a*) may be configured parallel to each other. In other examples, the ADC 100*a* may further include at least one additional ADC configured parallel to the first and second ADCs (upper/lower halves of 100*a*).

Since different first and second sampling clocks (the upper/lower sampling clocks) are configured to correspond to the first and second ADC (upper/lower halves of 100*a*), respectively, the first and second sampling clocks (upper/lower sampling clocks) may have reduced effects on each other. Accordingly, the first and second ADCs (the upper/lower halves of 100*a*) may have reduced noise, and may have a high resolution in accordance therewith. Further, the timing configurations of the first and second ADCs (upper/lower halves of 100a) may be more sophisticated and/or accurate.

The first and second ADCs (the upper/lower halves of 100a) may be synchronized with each other based on an interrupt request (Irq) of the IC. Accordingly, even when the first and second ADCs (the upper/lower halves of 100a) operate based on first and second sampling clocks (upper/lower sampling clocks), which are different from one another, the timing controls of the first and second ADCs (the upper/lower halves of 100a) may be more sophisticated or accurate. In this regard, the performance (e.g., a signal-to-noise ratio, a conversion speed, resolution, power consumption, reliability, etc.) of the ADC 100a can be further improved.

For example, the Irq may be an Irq of a timer 130 of the IC. The timer 130 may be provided in the process of designing and implementing the IC, and an Irq configuration of the timer 130 may be appropriately processed by a user.

For example, the first and second ADCs (the upper/lower halves of 100a) may include first and second ADC modulators (upper/lower sides of 110), respectively, and first and second ADC controllers (upper/lower halves of 120), respectively.

The first and second ADC modulators (upper/lower sides of 110) may convert the first and second analog values, respectively, into the first and second digital values (upper/lower digital-n-bits), respectively, based on the first and second sampling clocks (upper/lower sampling clock). An analog-to-digital conversion method of the first and second ADC modulators (upper/lower sides of 110) is not limited to a sigma-delta method, and may be a method of successive approximation or a method of arranging in parallel for each bit, for example. Such methods may also operate based on a sampling clock.

For example, the first and second ADCs (the upper/lower halves of 100a) may further include first and second decimation controllers (upper/lower sides of 115) and may perform decimation filtering on a value according to sigma-delta modulation.

An enable state of the first and second ADC controllers (upper/lower halves of 120) is determined based on the Irq of the timer 130, and the ADC modulators (upper/lower sides of 110) may be controlled based on a point in time at which the enable state changes.

For example, the first and second controllers (upper/lower halves of 120) may include first and second CDCs (upper/lower sides of 121), respectively, and/or first and second mean & amplitude step filters (upper/lower sides of 122), respectively. The first and second CDCs (upper/lower sides of 121) may control a timing and/or a delay of the first and second ADC modulators (upper/lower sides of 110), respectively, and the first and second mean & amplitude step filters (upper/lower sides of 122) may control an order or a combination of digital values of respective channels (CH1, CHN, CH1' and CHN').

For example, the first and second ADCs (the upper/lower halves of 100a) may further include first and second registers (upper/lower sides of 125), respectively. The first and second registers (upper/lower sides of 125) may sequentially store digital values, and the driver 220a may sequentially retrieve the stored digital values.

For example, the driver 220a may perform a proportional-integral-derivative (PID control action based on the first and second digital values (upper/lower digital-n-bits), and produce a driving signal based on the PID control action.

A period for the PID control action may be determined based on the other portion (e.g., a main clock of the IC) of the plurality of clocks, which is linked to the Irq of the timer 130.

The driver 220a may generate a driving current corresponding to the driving signal based on the PID control action and output the driving current to a voice coil motor 230.

A lens module 210 may include a magnetic body (e.g., permanent magnet, steel, etc.), and the magnetic body may provide the lens module 210 with an action/reaction of a Lorentz force based on the driving current flowing through the voice coil motor 230. Accordingly, the lens module 210 may move based on the driving signal and/or the driving current of the driver 220a.

At least one hall sensor 300 may detect a position of the lens module 210. As a number of the hall sensors 300 increases, a position detection range and/or a position detection resolution of the lens module 210 may be further increased. For example, at least the one hall sensor 300 may be disposed in a coil-shaped aperture of the voice coil motor 230, and the IC may also be disposed in the aperture.

The IC may include at least one amplifier 310, and the at least one amplifier 310 may amplify a difference voltage between a positive terminal INP and a negative terminal INN of the at least one Hall sensor 300.

From the viewpoint of the ADC 100a, the at least one amplifier 310 may be at least one channel (CH1, CHN, CH1' and CHN'). The ADC 100a may convert at least one analog value of the at least one channel (CH1, CHN, CH1' and CHN') into at least one digital value (digital-n-bits).

Referring to FIG. 1B, an analog-digital converter (ADC) 100b may include a driver 220b, and the driver 220b may include a PID controller 221b.

For example, the driver 220b can produce an Irq, the PID controller 221b can be linked to the Irq, while first and second ADC controllers (upper/lower halves of 120) may be provided with the Irq.

Referring to FIG. 1C, a driver 220c may include a PID controller 221c, a digital-to-analog converter (ADC) 222c and a VCM actuator 223c, and may include a timer 130.

The timer 130 may provide an Irq to the PID controller 221c within the driver 220c and may provide the Irq to the ADC 100c, an exterior to the driver 220c.

Figure 1D:
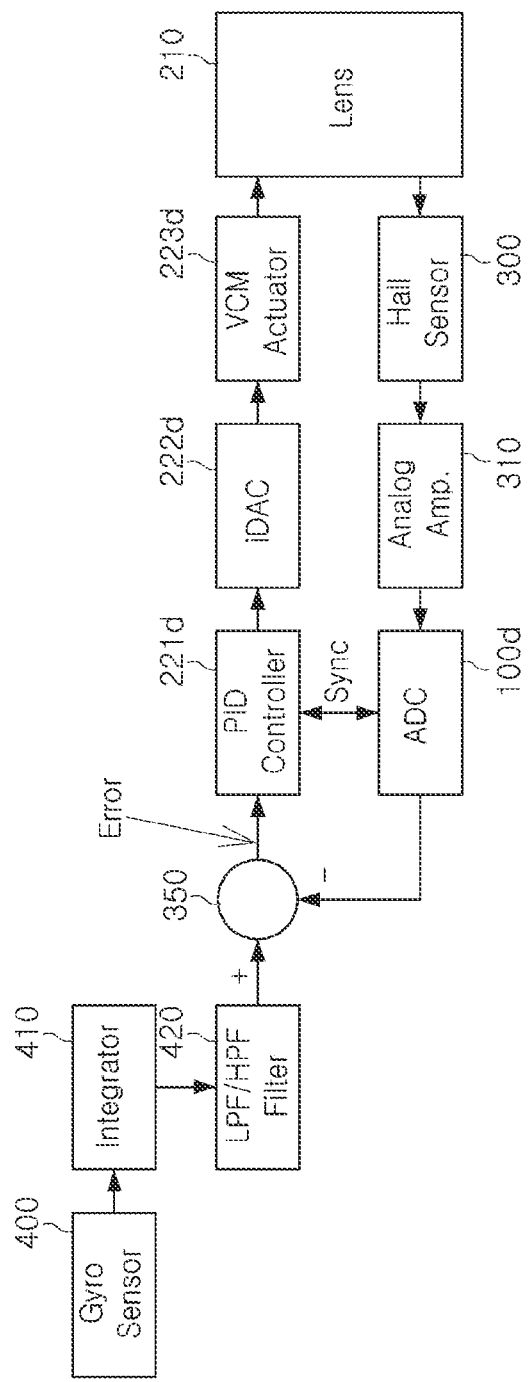
FIG. 1D is a block diagram illustrating an optical image stabilization structure that may be included in an analog-to-digital conversion apparatus, according to an embodiment.

FIG. 1D is a block diagram illustrating an optical image stabilization structure, which may be included in an analog-to-digital conversion apparatus, according to an embodiment.

Optical image stabilization means or system may move a lens module or an image sensor, to which light is incident through the lens module, in one direction when the lens module moves in the other direction, opposite to the one direction, such that sharpness of an image obtained from the image sensor is secured even if the lens module moves.

Referring to FIG. 1D, a gyro sensor 400 may detect acceleration when the lens module moves due to an external environment (e.g., camera user hand-shake), and an integrator 410 integrates the acceleration and converts the acceleration into a velocity. The filter 420 may control a DC offset and/or a high frequency (e.g., a frequency exceeding 20 Hz) noise of the gyro sensor 400 and/or the integrator 410 and provide output information to a summer 350.

An analog-to-digital converter (ADC) 100d may provide negative feedback information corresponding to a position of a lens module 210 to the summer 350, and a PID controller 221d may create information of a magnitude of Lorentz force to be applied to the lens module 210 by performing PID control based on a summation result of the summer 350. A digital-analog converter 222d may convert the information into an analog value, and the VCM actuator 223d may generate a driving current corresponding to the analog value, while the lens module 210 may move according to the driving current.

The analog-to-digital conversion apparatus, according to an embodiment, may be applied to autofocusing control of the lens module 210, and the ADC 100d and the driver (corresponding to the PID controller 221d) may be applied to a drive and a feedback of an autofocusing control structure.

As optical magnification of a lens of the lens module 210 increases, a lens barrel of the lens module 210 may become longer and a number of hall sensors 300 may increase. As the number of the hall sensors 300 increases, timing control of the ADC 100d may become more complex, and a number of clocks used in the ADC 100d may increase.

The analog-to-digital conversion apparatus, according to an example embodiment, may synchronize a plurality of different clocks based on the Irq of the IC, and may thus more efficiently deal with an increased size or improved performance of the lens module 210 and/or the hall sensor 300.

Further, the analog-to-digital conversion apparatus, according to an embodiment, may perform synchronization actions based on an Irq of one IC, and the one IC can be more efficiently disposed in an aperture of the voice coil motor. Accordingly, an overall size of a camera module including the analog-to-digital conversion apparatus and the lens module may be efficiently reduced.

Figure 2A:
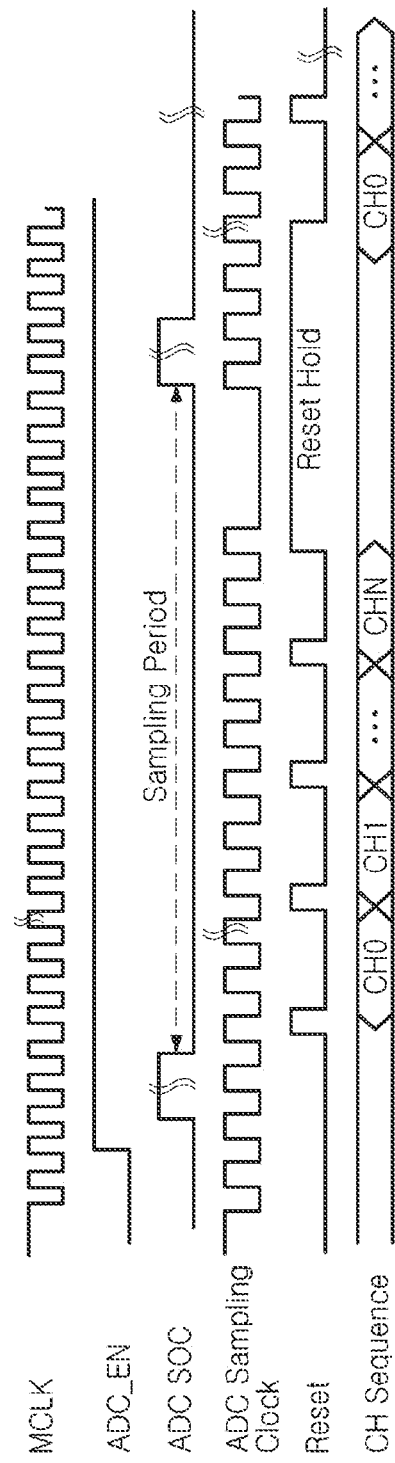
FIGS. 2A and 2B are timing diagrams illustrating optical image stabilization structures that may be included in an analog-digital conversion apparatus, according to an embodiment.
Figure 2B:
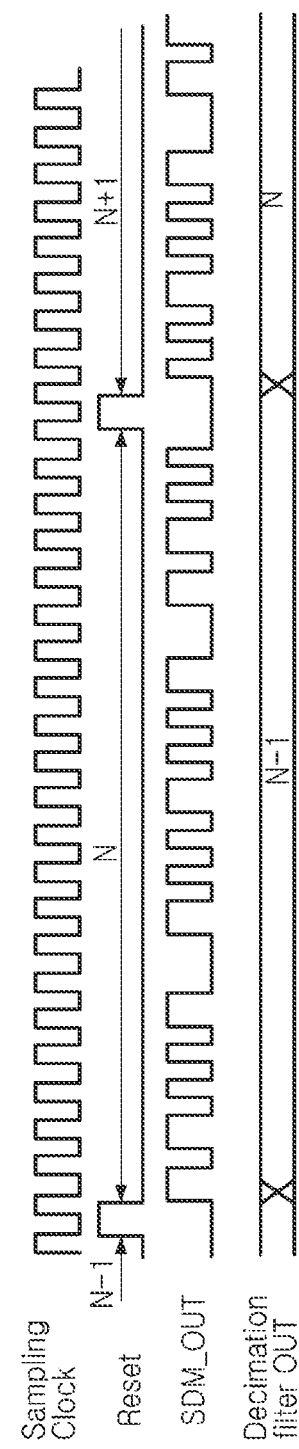

FIGS. 2A and 2B are timing diagrams illustrating optical image stabilization structures that may be included in an analog-digital conversion apparatus, according to an embodiment.

Referring to FIG. 2A, a sampling clock (ADC sampling clock) corresponding to an ADC and a main clock (MCLK) of an IC may be different from each other. When the sampling clock (ADC sampling clock) is configured to correspond to the ADC, the main clock (MCLK) may be configured to correspond to a driver. When the sampling clock (ADC sampling clock) is configured to correspond to a first ADC, the main clock (MCLK) may be configured to correspond to a second ADC. A frequency difference and/or a phase difference between the ADC sampling clock and the main clock (MCLK) may be variously determined according to designs thereof.

Referring to FIG. 2A, an ADC controller may operate in an enable state when a value of an enable state signal ADC_EN is high and may not operate when a value of the enable state signal ADC_EN is low. The ADC controller may convert a unit analog value into a unit digital value per sampling period of a start-of-conversion time signal (ADC SOC). The sampling period may correspond to a total time for which an analog value of each of a plurality of channels (CH0, CH1 and CHN) is converted into a digital value. The plurality of channels (CH0, CH1 and CHN) may correspond to a plurality of hall sensors. The sampling period may be longer as a number of the plurality of channels (CH0, CH1 and CHN) increases and may thus be appropriately determined depending on a required time, resolution, power consumption, and the like.

The ADC controller can convert an analog value of one of the plurality of channels (CH0, CH1 and CHN) into a digital value every cycle of a reset signal (Reset), and a number of the reset signals (Reset) corresponding to the sampling period may correspond to the number of the plurality of channels (CH0, CH1 and CHN). The ADC controller may provide the reset signal (Reset) to the ADC modulator.

The reset signal (Reset) can have a reset hold of a time after converting the analog value of the last channel (CHN) among the plurality of channels (CH0, CH1 and CHN) into a digital value, and the reset hold may be linked to a value of the start-of-conversion time signal (ADC SOC).

Referring to FIG. 2B, the ADC modulator may output an output value (SDM_OUT) in an N-th cycle of the reset signal (Reset). A decimation controller illustrated in FIGS. 1A to 1C may filter the output value (SDM_OUT) of the ADC modulator to output an N-bit digital value (decimation filter OUT).

The N-bit digital value (decimation filter OUT) may be stored in a storage of a channel corresponding to the register illustrated in FIGS. 1A to 1C. Correspondence of the channels in the register may be in a channel sequence, and the channel sequence may be provided to the ADC controller and/or the ADC modulator.

Figure 3:
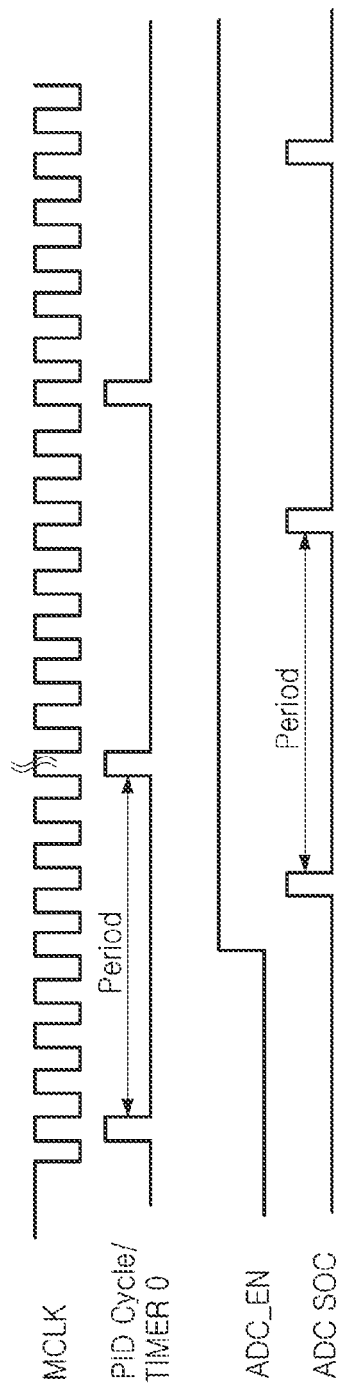
FIG. 3 is a timing diagram illustrating synchronization of a signal of an enable state (ADC_EN) and a signal of a start-of-conversion time (ADC SOC) of an analog-digital conversion apparatus, according to an embodiment.

FIG. 3 is a timing diagram illustrating synchronization of a signal of an enable state (ADC_EN) and a signal of a start-of-conversion time (ADC SOC) of an analog-digital conversion apparatus, according to an embodiment.

Referring to FIG. 3, a signal of an enable state (ADC_EN) and a signal of a start-of-conversion time (ADC SOC) may be linked, and a signal of PID timing (PID cycle) of a driver may be linked to a timer (TIMER 0) of an IC. The start-of-conversion time may be synchronized at a point in time at which the enable state changes. Alternatively, the signal of PID timing (PID cycle) may be replaced with a signal of a start-of-conversion time of a second ADC, and the start-of-conversion time signal (ADC SOC) may correspond to a first ADC.

A cycle of the PID time signal (PID cycle) and a cycle of the start-of-conversion time signal (ADC SOC) may be linked to each other, may be based on an Irq of the timer (TIMER 0) of the IC. Since a point in time at which the Irq is provided can be determined by a user, a point in time at which the ADC operates can be determined flexibly.

Figure 4:
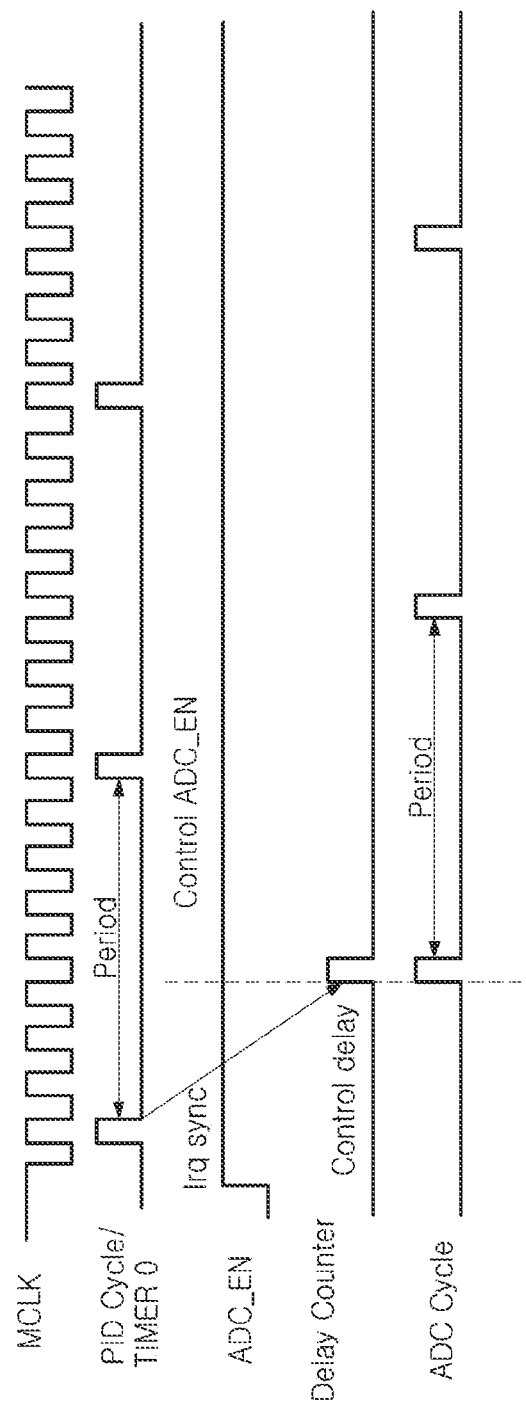
FIGS. 4 and 5 are timing diagrams illustrating determination of a point in time at which an enable state signal (ADC_EN) of an analog-digital conversion apparatus changes based on an Irq, according to an embodiment.
Figure 5:
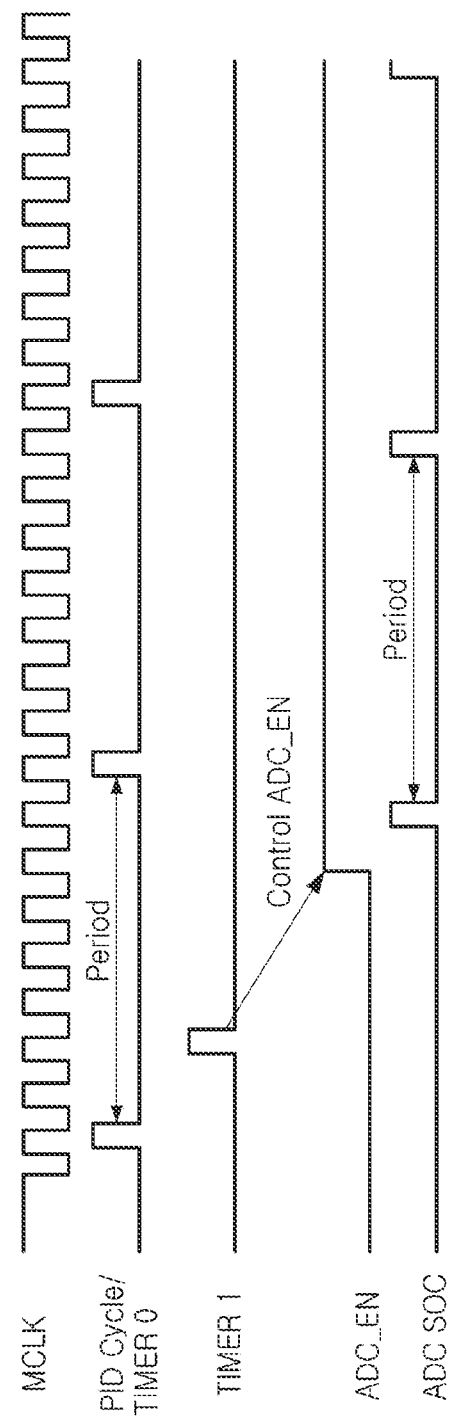

FIGS. 4 and 5 are timing diagrams illustrating determination of a point in time at which an enable state signal (ADC_EN) of an analog-digital conversion apparatus changes based on an Irq, according to an embodiment.

Referring to FIG. 4, a cycle of an ADC (ADC Cycle) corresponding to a start-of-conversion time signal and a signal of PID timing (PID cycle) of a driver and/or a timer (TIMER 0) of an IC may be synchronized through an Irq (Irq sync). Alternatively, the signal of PID timing (PID cycle) may be replaced with a start-of-conversion time signal of a second ADC, and a signal of the start-of-conversion time (ADC SOC) may correspond to a first ADC.

For example, the signal of PID timing (PID cycle) of the driver and/or the timer (TIMER 0) of the IC may be synchronized to a delay counter signal of a CDC illustrated in in FIGS. 1A to 1C through the Irq. The ADC may convert a unit analog value into a unit digital value every sampling period from a point in time determined based on a control delay of a delay counter signal.

Referring to FIG. 5, a timer (TIMER 1) linked to the signal of PID timing (PID cycle) of the driver and/or the timer (TIMER 0) of the IC may be synchronized to an enable signal (ADC_EN) through the Irq. Alternatively, the signal of PID timing (PID cycle) may be replaced with a start-of-conversion time signal of the second ADC, and the start-of-conversion time signal (ADC SOC) may correspond to the first ADC.

Since the enable state signal (ADC_EN) and the start-of-conversion time signal (ADC SOC) can be synchronized with each other, the ADC controller can control the ADC modulator based on a point in time at which the enable state signal (ADC_EN) changes.

Figure 6:
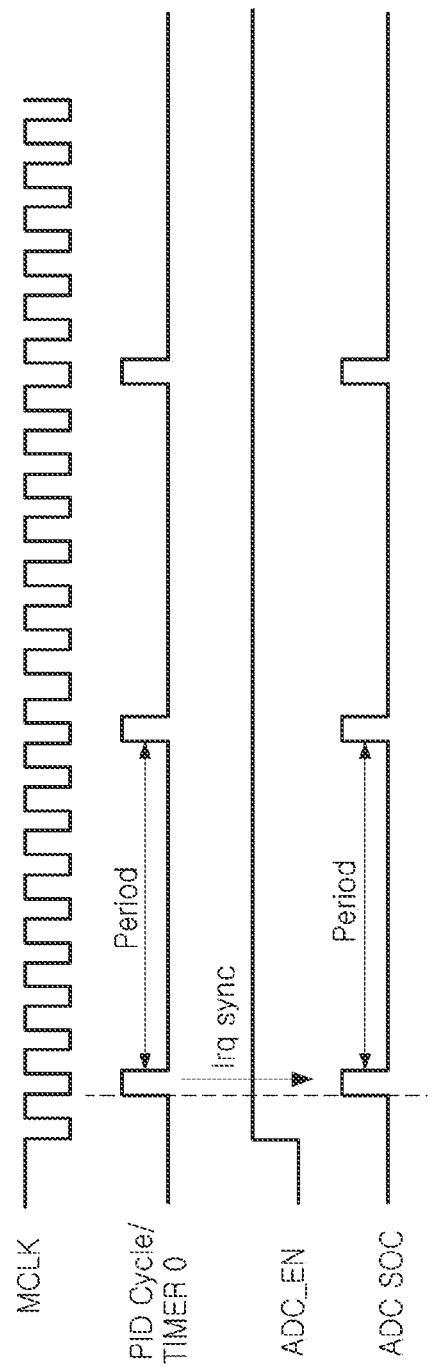
FIG. 6 is a timing diagram illustrating an Irq itself being used as a point in time of a start-of-conversion time (ADC SOC) of an analog-digital conversion apparatus, according to an embodiment.

FIG. 6 is a timing diagram illustrating an Irq itself being used as a point in time of a start-of-conversion time (ADC SOC) of an analog-digital conversion apparatus, according to an embodiment.

Referring to FIG. 6, a PID cycle signal of a timer (TIMER 0) and/or a driver of an IC and a signal of a start-of-conversion time (ADC SOC) the signal may be synchronized to a main clock (MCLK) through an Irq. Alternatively, the signal of the PID cycle may be replaced with a signal of the start-of-conversion time of a second ADC, and the signal of the start-of-conversion time (ADC SOC) may correspond to a first ADC.

That is, a reference point in time of the start-of-conversion time signal (ADC SOC) can be determined according to a point in time at which an ADC controller receives an Irq, and the Irq can directly trigger the signal of the start-of-conversion time (ADC SOC). Accordingly, the ADC may be flawlessly synchronized.

Figure 7A:
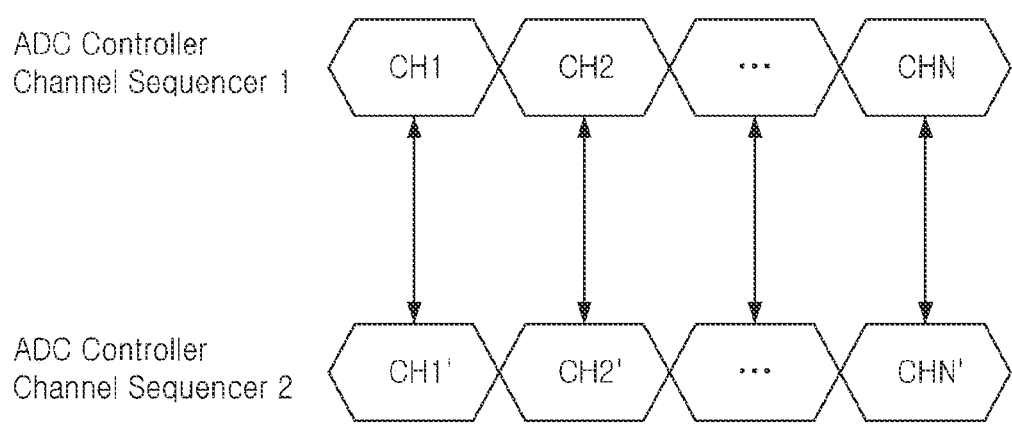
FIGS. 7A and 7B are block diagrams illustrating synchronization between at least one first channel and at least one second channel of first and second analog-digital conversion apparatuses, according to an embodiment.
Figure 7B:
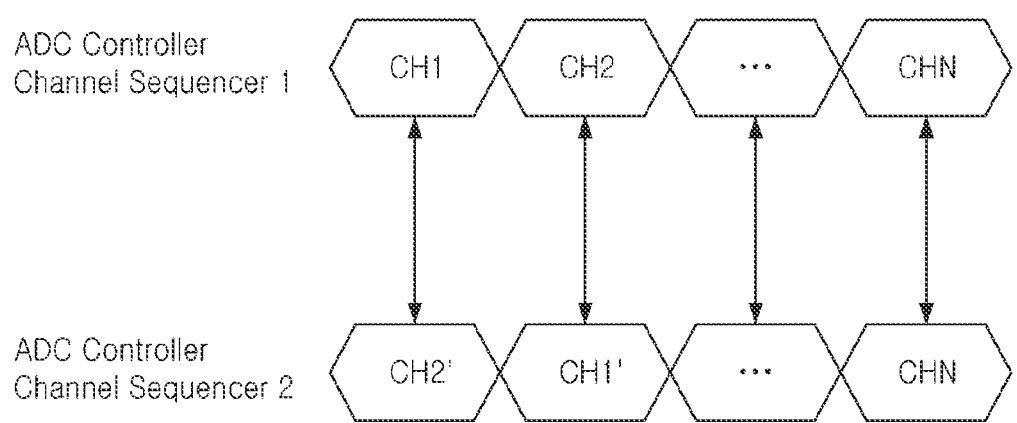

FIGS. 7A and 7B are block diagrams exemplifying synchronization between at least one first channel and at least one second channel of first and second analog-digital conversion apparatuses, according to an embodiment.

Referring to FIGS. 7A and 7B, an ADC controller channel sequencer 1 and an ADC controller channel sequencer 2 may be shared respectively in at least a portion of registers, ADC controllers, and ADC modulators.

Since the ADC controller channel sequencers 1 and 2 may be independent of each other, an order relation of a plurality of channels of the ADC controller channel sequencers 1 and 2 may be appropriately determined according to designs thereof.

As set forth above, according to embodiments disclosed herein, an analog-digital conversion apparatus may reduce a noise and have a high resolution according to the reduced noise. In addition, because timing configuration/control can be more sophisticated and/or accurate, overall performance (e.g., signal-to-noise ratio, conversion speed, resolution, power consumption, reliability, etc.) may be further improved.

The ADCs 100a to 100d, the decimation controllers 115, the ADC controller 120, the CDCs 121, the mean and amplitude stop filters 122, the registers 125, the timer 130, the drivers 220a to 220c, the PID controllers 221b to 221d, the iDACs 222c and 222d, the VCM actuators 223c and 223d, the summer 350, the integrator 410, and the LPF/HPF filter 420 in FIGS. 1 to 7B that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1 to 7B that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An analog-digital conversion apparatus, comprising:
    an analog-digital converter (ADC) included in an integrated circuit (IC) and configured to operate based on a sampling clock constituting a portion of a plurality of clocks; and
    a driver included in the IC and configured to operate based on another portion of the plurality of clocks, and produce a driving signal based on a digital value output from the ADC,
    wherein the ADC and the driver are synchronized with each other based on an interrupt request (Irq) of the IC.

2. The analog-digital conversion apparatus of claim 1, wherein the Irq is a timer Irq of the IC.

3. The analog-digital conversion apparatus of claim 1, wherein the ADC comprises:
    an ADC modulator configured to convert an analog value into the digital value, based on the sampling clock; and
    an ADC controller configured to determine whether the ADC is in an enable state based on the Irq, and control the ADC modulator based on a point in time at which the enable state changes.

4. The analog-digital conversion apparatus of claim 3, wherein the ADC controller is further configured to control a conversion timing of the ADC modulator, based on a start-of-conversion time signal having a unit analog-digital conversion period, and
    wherein a start-of-conversion time indicated by the start-of-conversion time signal is synchronized at the point in time at which the enable state changes.

5. The analog-digital conversion apparatus of claim 1, wherein the ADC comprises:
    an ADC modulator configured to convert an analog value into the digital value, based on the sampling clock; and
    an ADC controller configured to control a conversion timing of the ADC modulator, based on a start-of-conversion time signal having a unit analog-digital conversion period, and
    wherein a reference point in time of the start-of-conversion time signal is determined depending on a point in time at which the ADC controller receives the Irq.

6. The analog-digital conversion apparatus of claim 1, wherein the ADC comprises:
    an ADC modulator configured to sequentially convert at least one analog value input from at least one channel into the digital value; and
    an ADC controller configured to generate a reset signal corresponding to a conversion timing of the at least one analog value of the ADC modulator, based on a start-of-conversion time signal having a period in which the at least one analog value is converted into the digital value, and provide the reset signal to the ADC modulator.

7. The analog-digital conversion apparatus of claim 6, wherein the at least one channel corresponds to at least one hall sensor.

8. The analog-digital conversion apparatus of claim 1, wherein the driver is further configured to perform a PID control action based on the digital value, and generate the driving signal based on the PID control action, and
    wherein a period of the PID control action is determined based on the other portion of the plurality of clocks, and the other portion of the clocks is linked to the Irq.

9. The analog-digital conversion apparatus of claim 8, wherein the driver is further configured to generate a driving current corresponding to the driving signal, based on the PID control action, and output the driving current to a voice coil motor.

10. The analog-digital conversion apparatus of claim 1, wherein the ADC comprises:
    a first ADC configured to convert a first analog value into a first digital value, based on a first sampling clock of the sampling clock; and
    a second ADC configured to convert a second analog value into a second digital value, based on a second sampling clock of the sampling clock, and
    wherein the first and second ADCs are synchronized with each other based on the Irq.

11. An analog-digital conversion apparatus, comprising:
a first analog-digital converter (ADC) included in an integrated circuit (IC), and configured to convert a first analog value into a first digital value, based on a first sampling clock constituting a portion of a plurality of clocks; and
a second ADC included in an integrated circuit (IC) and configured to convert a second analog value into a second digital value, based on a second sampling clock constituting another portion of the plurality of clocks,
wherein the first and second ADCs are configured to be synchronized with each other based on an interrupt request (Irq) of the IC.

12. The analog-digital conversion apparatus of claim 11, wherein the Irq is a timer Irq of the IC.

13. The analog-digital conversion apparatus of claim 11, wherein the first ADC comprises:
a first ADC modulator configured to convert the first analog value into the first digital value, based on the first sampling clock; and
a first ADC controller configured to determine whether the first ADC controller is in a first enable state, based on the Irq, and configured to control the first ADC modulator, based on a point in time at which the first enable state changes,
wherein the second ADC comprises:
a second ADC modulator configured to convert the second analog value into the second digital value, based on the second sampling clock; and
a second ADC controller determining whether the second ADC controller is in a second enable state, based on the Irq, and configured to control the second ADC modulator, based on a point in time at which the second enable state changes.

14. The analog-digital conversion apparatus of claim 13, wherein the first ADC controller is further configured to control a conversion timing of the first ADC modulator, based on a first start-of-conversion time signal having a first unit analog-digital conversion period,
wherein a start-of-conversion time indicated by the first start-of-conversion time signal is synchronized at the point in time at which the first enable state changes,
the second ADC controller is further configured to control a conversion timing of the second ADC modulator, based on a second start-of-conversion time signal having a second unit analog-digital conversion period, and
wherein a start-of conversion time indicated by the second start-of-conversion time signal is synchronized at the point in time at which the second enable state changes.

15. The analog-digital conversion apparatus of claim 11, wherein the first ADC comprises:
a first ADC modulator configured to convert the first analog value into the first digital value, based on the first sampling clock; and
a first ADC controller configured to control a conversion timing of the first ADC modulator, based on a first start-of-conversion time signal having a first unit analog-digital conversion period,
wherein the second ADC comprises:
a second ADC modulator configured to convert the second analog value into the second digital value, based on the second sampling clock; and
a second ADC controller configured to control a conversion timing of the second ADC modulator, based on a second start-of-conversion time signal having a second unit analog-digital conversion period,
wherein a reference point in time of the first start-of-conversion time signal is determined depending on a point in time at which the first ADC controller receives the Irq, and
wherein a reference point in time of the second start-of-conversion time signal is determined depending on a point in time at which the second ADC controller receives the Irq.

16. The analog-digital conversion apparatus of claim 11, wherein the first ADC comprises:
a first ADC modulator configured to sequentially convert at least one first analog value input from at least one first channel into the first digital value; and
a first ADC controller configured to generate a first reset signal corresponding to a conversion timing of the at least one first analog value of the first ADC modulator, based on a first start-of-conversion time signal having a period in which the at least one first analog value is converted into the first digital value, and provide the first reset signal to the first ADC modulator, and
wherein the second ADC comprises:
a second ADC modulator configured to sequentially convert at least one second analog value input from at least one second channel into the second digital value; and
a second ADC controller configured to generate a second reset signal corresponding to a conversion timing of the at least one second analog value of the second ADC modulator, based on a second start-of-conversion time signal having a period in which the at least one second analog value is converted into the second digital value, and provide the second reset signal to the second ADC modulator.

17. A camera module, comprising:
a lens module;
a sensor configured to detect a position of the lens module, and generate an analog value based on the detected position of the lens module; and
an integrated circuit (IC) including:
an analog-digital converter (ADC) configured to convert the analog value into a digital value based on a sampling clock constituting a portion of a plurality of clocks; and
a driver configured to operate based on another portion of the plurality of clocks, and produce a driving signal, based on a digital value output from the ADC, to move the lens module,
wherein the ADC and the driver are synchronized with each other based on an interrupt request (Irq) of the IC.

18. The camera module of claim 17, wherein the Irq is a timer Irq of the IC.

19. The camera module of claim 17, wherein the ADC is further configured to determine whether the ADC is in an enable state based on the Irq, and
wherein the ADC is configured to control the converting of the analog value into the digital value based on a point in time at which the enable state changes.

20. The camera module of claim 17, wherein the driver is further configured to perform a PID control action based on the digital value, and generate the driving signal based on the PID control action, and
wherein a period of the PID control action is determined based on the other portion of the plurality of clocks, and the other portion of the clocks is linked to the Irq.

* * * * *